US008659369B2

United States Patent
Rofougaran et al.

(10) Patent No.: US 8,659,369 B2
(45) Date of Patent: *Feb. 25, 2014

(54) IC PACKAGE WITH EMBEDDED FILTERS

(75) Inventors: Ahmadreza Rofougaran, Newport Coast, CA (US); Maryam Rofougaran, Rancho Palos Verdes, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/417,039

(22) Filed: Mar. 9, 2012

(65) Prior Publication Data

US 2012/0169432 A1    Jul. 5, 2012

Related U.S. Application Data

(63) Continuation of application No. 11/956,085, filed on Dec. 13, 2007, now Pat. No. 8,134,425.

(51) Int. Cl.
*H03H 7/00* (2006.01)
*H01P 3/08* (2006.01)

(52) U.S. Cl.
USPC .......................................... 333/174; 333/204

(58) Field of Classification Search
USPC ................. 333/185, 202, 204, 239, 205, 174; 455/333
See application file for complete search history.

(56) References Cited

U.S. PATENT DOCUMENTS

| | | | | |
|---|---|---|---|---|
| 5,436,601 | A * | 7/1995 | Mandai et al. | 333/138 |
| 5,502,422 | A * | 3/1996 | Newell et al. | 333/207 |
| 6,346,865 | B1 * | 2/2002 | Callewaert et al. | 333/185 |
| 6,895,190 | B1 * | 5/2005 | Neumann et al. | 398/202 |
| 7,012,484 | B2 * | 3/2006 | Chang et al. | 333/175 |
| 7,149,496 | B2 * | 12/2006 | Horiuchi et al. | 455/333 |
| 7,339,445 | B2 * | 3/2008 | Aigner et al. | 333/133 |
| 8,134,425 | B2 * | 3/2012 | Rofougaran et al. | 333/174 |

* cited by examiner

*Primary Examiner* — Dean O Takaoka
*Assistant Examiner* — Alan Wong
(74) *Attorney, Agent, or Firm* — Farjami & Farjami LLP

(57) ABSTRACT

Methods and systems for filters embedded in an integrated circuit package are disclosed and may include controlling filtering of signals within an integrated circuit via one or more filter components embedded within a multi-layer package bonded to the integrated circuit. The one or more filter components may be electrically coupled to one or more switchable capacitors within the integrated circuit. The filter components may include transmission line devices, microstrip filters, transformers, surface mount devices, inductors, and/or coplanar waveguide filters. The filter components may be fabricated utilizing metal conductive layers and/or ferromagnetic layers deposited on and/or embedded within the multi-layer package. The integrated circuit may be electrically coupled to the multi-layer package utilizing a flip-chip bonding technique.

19 Claims, 6 Drawing Sheets

IC PACKAGE WITH EMBEDDED FILTERS

CROSS-REFERENCE TO RELATED APPLICATIONS/INCORPORATION BY REFERENCE

This is a continuation of application Ser. No. 11/956,085 filed Dec. 13, 2007 now U.S. Pat. No. 8,134,425.

FEDERALLY SPONSORED RESEARCH OR DEVELOPMENT

[Not Applicable]

MICROFICHE/COPYRIGHT REFERENCE

[Not Applicable]

FIELD OF THE INVENTION

Certain embodiments of the invention relate to wireless communication. More specifically, certain embodiments of the invention relate to a method and system for filters embedded in an integrated circuit package.

BACKGROUND OF THE INVENTION

Mobile communications have changed the way people communicate and mobile phones have been transformed from a luxury item to an essential part of every day life. The use of mobile phones is today dictated by social situations, rather than hampered by location or technology. While voice connections fulfill the basic need to communicate, and mobile voice connections continue to filter even further into the fabric of every day life, the mobile Internet is the next step in the mobile communication revolution. The mobile Internet is poised to become a common source of everyday information, and easy, versatile mobile access to this data will be taken for granted.

As the number of electronic devices enabled for wireline and/or mobile communications continues to increase, significant efforts exist with regard to making such devices more power efficient. For example, a large percentage of communications devices are mobile wireless devices and thus often operate on battery power. Additionally, transmit and/or receive circuitry within such mobile wireless devices often account for a significant portion of the power consumed within these devices. Moreover, in some conventional communication systems, transmitters and/or receivers are often power inefficient in comparison to other blocks of the portable communication devices. Accordingly, these transmitters and/or receivers have a significant impact on battery life for these mobile wireless devices.

Further limitations and disadvantages of conventional and traditional approaches will become apparent to one of skill in the art, through comparison of such systems with the present invention as set forth in the remainder of the present application with reference to the drawings.

BRIEF SUMMARY OF THE INVENTION

A system and/or method for filters embedded in an integrated circuit package, substantially as shown in and/or described in connection with at least one of the figures, as set forth more completely in the claims.

Various advantages, aspects and novel features of the present invention, as well as details of an illustrated embodiment thereof, will be more fully understood from the following description and drawings.

DETAILED DESCRIPTION OF THE INVENTION

Certain aspects of the invention may be found in a method and system for filters embedded in an integrated circuit package. Exemplary aspects of the invention may comprise controlling filtering of signals within an integrated circuit via one or more filter components embedded within a multi-layer package bonded to the integrated circuit. The filter components may comprise transmission line devices, microstrip filters, transformers, surface mount devices, inductors, and/or coplanar waveguide filters. The filter components may be fabricated utilizing metal conductive layers and/or ferromagnetic layers deposited on and/or embedded within the multi-layer package. The integrated circuit may be electrically coupled to the multi-layer package utilizing a flip-chip bonding technique.

Figure 1:
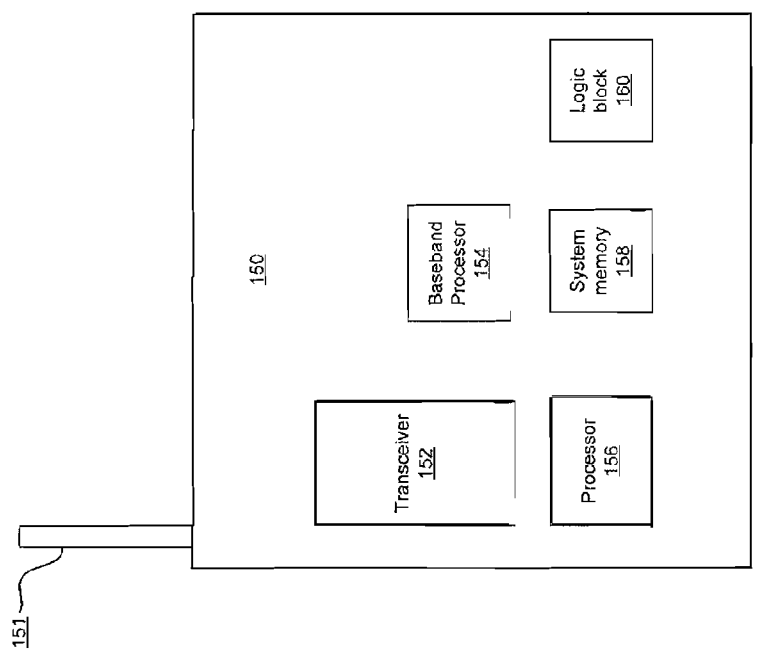
FIG. 1 is a block diagram of an exemplary wireless system, which may be utilized in accordance with an embodiment of the invention.

FIG. 1 is a block diagram of an exemplary wireless system, which may be utilized in accordance with an embodiment of the invention. Referring to FIG. 1, the wireless system 150 may comprise an antenna 151, a transceiver 152, a baseband processor 154, a processor 156, a system memory 158, and a logic block 160. The antenna 151 may be used for reception and/or transmission of RF signals.

The transceiver 152 may comprise suitable logic, circuitry, and/or code that may be enabled to modulate and upconvert baseband signals to RF signals for transmission by one or more antennas, which may be represented generically by the antenna 151. The transceiver 152 may also be enabled to downconvert and demodulate received RF signals to baseband signals. The RF signals may be received by one or more antennas, which may be represented generically by the antenna 151. Different wireless systems may use different antennas for transmission and reception. The transceiver 152 may be enabled to execute other functions, for example, filtering the baseband and/or RF signals, and/or amplifying the baseband and/or RF signals.

In an embodiment of the invention, the transceiver 152 may be integrated on a multi-layer package comprising filter components on the top and the bottom surfaces as well as embedded within the package. The package may comprise a multi-layer structure to which integrated circuits may be flip-chip bonded. The incorporation of RF filters on integrated circuits may be increasingly difficult as the frequency of operation of devices increases to the tens of GHz range and/or decreases to the GHz range. Additionally, incorporating filter components on an integrated circuit may take valuable chip real estate, increasing chip size and cost. By utilizing filter elements in the multi-layer package, the size of these devices may be greatly reduced, which may be increasingly important as the frequency of operation of the wireless system 150 may be extended to the 60 GHz range or below the GHz range.

Filter components incorporated into the wireless system 150 may comprise lumped element capacitors, inductors, or transformers, and/or distributed element devices such as transmission lines, for example. In another embodiment of the invention, filter components may comprise surface mount devices soldered to the multi-layer package, described further with respect to FIG. 2.

The baseband processor 154 may comprise suitable logic, circuitry, and/or code that may be enabled to process baseband signals for transmission via the transceiver 152 and/or the baseband signals received from the transceiver 152. The processor 156 may be any suitable processor or controller such as a CPU or DSP, or any type of integrated circuit processor. The processor 156 may comprise suitable logic, circuitry, and/or code that may be enabled to control the operations of the transceiver 152 and/or the baseband processor 154. For example, the processor 156 may be utilized to update and/or modify programmable parameters and/or values in a plurality of components, devices, and/or processing elements in the transceiver 152 and/or the baseband processor 154.

Control and/or data information, which may comprise the programmable parameters, may be transferred from other portions of the wireless system 150, not shown in FIG. 1, to the processor 156. Similarly, the processor 156 may be enabled to transfer control and/or data information, which may include the programmable parameters, to other portions of the wireless system 150, not shown in FIG. 1, which may be part of the wireless system 150.

The processor 156 may utilize the received control and/or data information, which may comprise the programmable parameters, to determine an operating mode of the transceiver 152. For example, the processor 156 may be utilized to select a specific frequency for a local oscillator, a specific gain for a variable gain amplifier, configure the local oscillator and/or configure the variable gain amplifier for operation in accordance with various embodiments of the invention. Moreover, the specific frequency selected and/or parameters needed to calculate the specific frequency, and/or the specific gain value and/or the parameters, which may be utilized to calculate the specific gain, may be stored in the system memory 158 via the processor 156, for example. The information stored in system memory 158 may be transferred to the transceiver 152 from the system memory 158 via the processor 156. The system memory 158 may comprise suitable logic, circuitry, and/or code that may be enabled to store a plurality of control and/or data information, including parameters needed to calculate frequencies and/or gain, and/or the frequency value and/or gain value.

The logic block 160 may comprise suitable logic, circuitry, and/or code that may enable controlling of various functionalities of the wireless system 150. For example, the logic block 160 may comprise one or more state machines that may generate signals to control the transceiver 152 and/or the baseband processor 154. The logic block 160 may also comprise registers that may hold data for controlling, for example, the transceiver 152 and/or the baseband processor 154. The logic block 160 may also generate and/or store status information that may be read by, for example, the processor 156. Amplifier gains and/or filtering characteristics, for example, may be controlled by the logic block 160.

Figure 2:
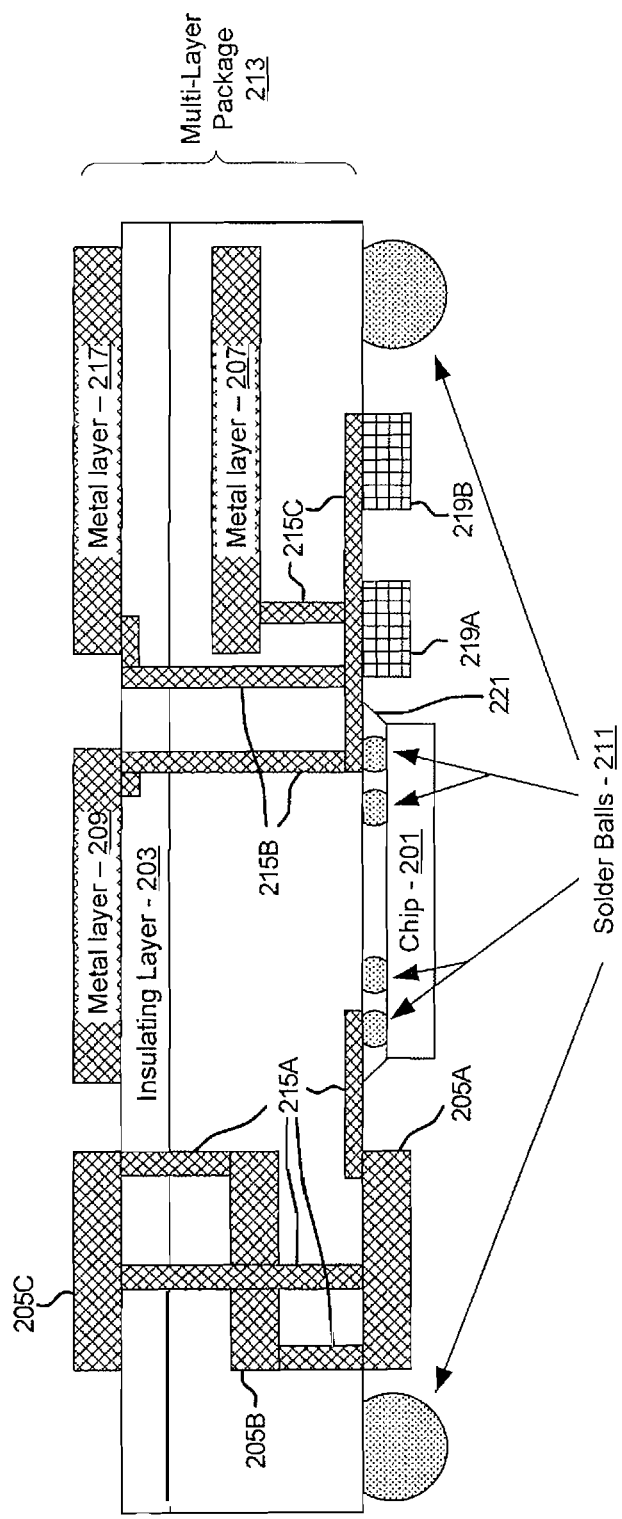
FIG. 2 is a block diagram illustrating a cross sectional view of a multi-layer package with integrated filter components, in accordance with an embodiment of the invention.

FIG. 2 is a block diagram illustrating a cross sectional view of a multi-layer package with integrated filter components, in accordance with an embodiment of the invention. Referring to FIG. 2, there is shown a chip 201, an insulating layer 203, metal layers 205A, 205B, 205C, 207, 209, 215A, 215B, 215C and 217, solder balls 211, multi-layer package 213, surface mount components 219A and 219B, and thermal epoxy 221.

The chip 201, or integrated circuit, may comprise the transceiver 152 described with respect to FIG. 1, or may also comprise any other integrated circuit within the wireless system 150 that may require filter components and/or devices. The chip 201 may be bump-bonded or flip-chip bonded to the multi-layer package 213 utilizing the solder balls 211. In this manner, wire bonds connecting the chip 201 to the multi-layer package 213 may be eliminated, reducing and/or eliminating uncontrollable stray inductances due to wire bonds. In addition, the thermal conductance out of the chip 201 may be greatly improved utilizing the solder balls 211 and the thermal epoxy 221. The thermal epoxy 221 may be electrically insulating but thermally conductive to allow for thermal energy to be conducted out of the chip 201 to the much larger thermal mass of the multilayer package 213.

The metal layers 205A, 205B, 205C, 207, 209, 215A, 215B, 215C and 217 may comprise deposited metal layers utilized to delineate impedance matching devices. The metal layer 209 may be patterned such that it may comprise a transmission line that may be utilized to impedance match a power amplifier in the chip 201 to an antenna, such as the antenna 151 described with respect to FIG. 1, for example. In another embodiment of the invention, the metal layers 201 and 217 may comprise a microstrip structure, the impedance of which may be tuned, for example.

In an embodiment of the invention, one or more of the metal layers may comprise ferromagnetic and/or ferrimagnetic layers utilized to define devices such as transformers, inductors, baluns, isolators, circulators, and gyrators. Accordingly, the metal layers 205A, 205B, 205C and 215A may comprise a transformer that may be utilized to provide inductance for a filter, for example.

The metal layers 215C may provide electrical contact to the surface mount devices 219a and 219B from the chip 201 via the solder balls 211. The number of metal layers may not be limited to the number of metal layers 205A, 205B, 205C, 207, 209, 215A, 215B, 215C and 217 shown in FIG. 2. Accordingly, there may be any number of layers embedded within the multi-layer package 213, depending on the number of contacts on the chip 201 coupled to the solder balls 211, and the number of impedance matching devices fabricated within and/or on the multi-layer package 213.

The solder balls 211 may comprise spherical balls of metal to provide electrical, thermal and physical contact between the chip 201 and the multi-layer package 213. In making the contact with the solder balls 211, the chip may be pressed with enough force to squash the metal spheres somewhat, and may be performed at an elevated temperature to provide suitable electrical resistance and physical bond strength. The thermal epoxy 221 may fill the volume between the solder balls 211 and may provide a high thermal conductance path for heat transfer out of the chip 201. The solder balls 211 may also be utilized to provide electrical, thermal and physical contact between the multi-layer package 213 and a printed circuit board comprising other parts of the wireless system 150, described with respect to FIG. 1.

The surface mount devices 219A and 219B may comprise discrete circuit elements such as resistors, capacitors, inductors, and diodes, for example. The surface mount devices 219A and 219B may be soldered to the multi-layer package 213 to provide electrical contact.

In operation, the chip 201 may comprise an RF front end, such as the RF transceiver 152, described with respect to FIG. 1, and may be utilized to transmit and receive RF signals. The chip 201 may be electrically coupled to filter components or devices fabricated on and/or within the multi-layer package 213, such as transformers, baluns, transmission lines, inductors, capacitors, microstrip filters, coplanar waveguide filters and surface mount devices, for example. Heat from the chip 201 may be conducted to the multi-layer package via the thermal epoxy 221 and the solder balls 211. In an embodiment of the invention, an array of capacitors in the chip 201 may be used in conjunction with filter components and devices in and/or on the multi-layer package 213 to create narrow-bandwidth, variable frequency filter capability. In this manner, filter performance may be significantly improved over conventional systems that utilize a wide bandwidth filter to cover all possible frequencies, and thus allow more unwanted signals to pass.

Figure 3:
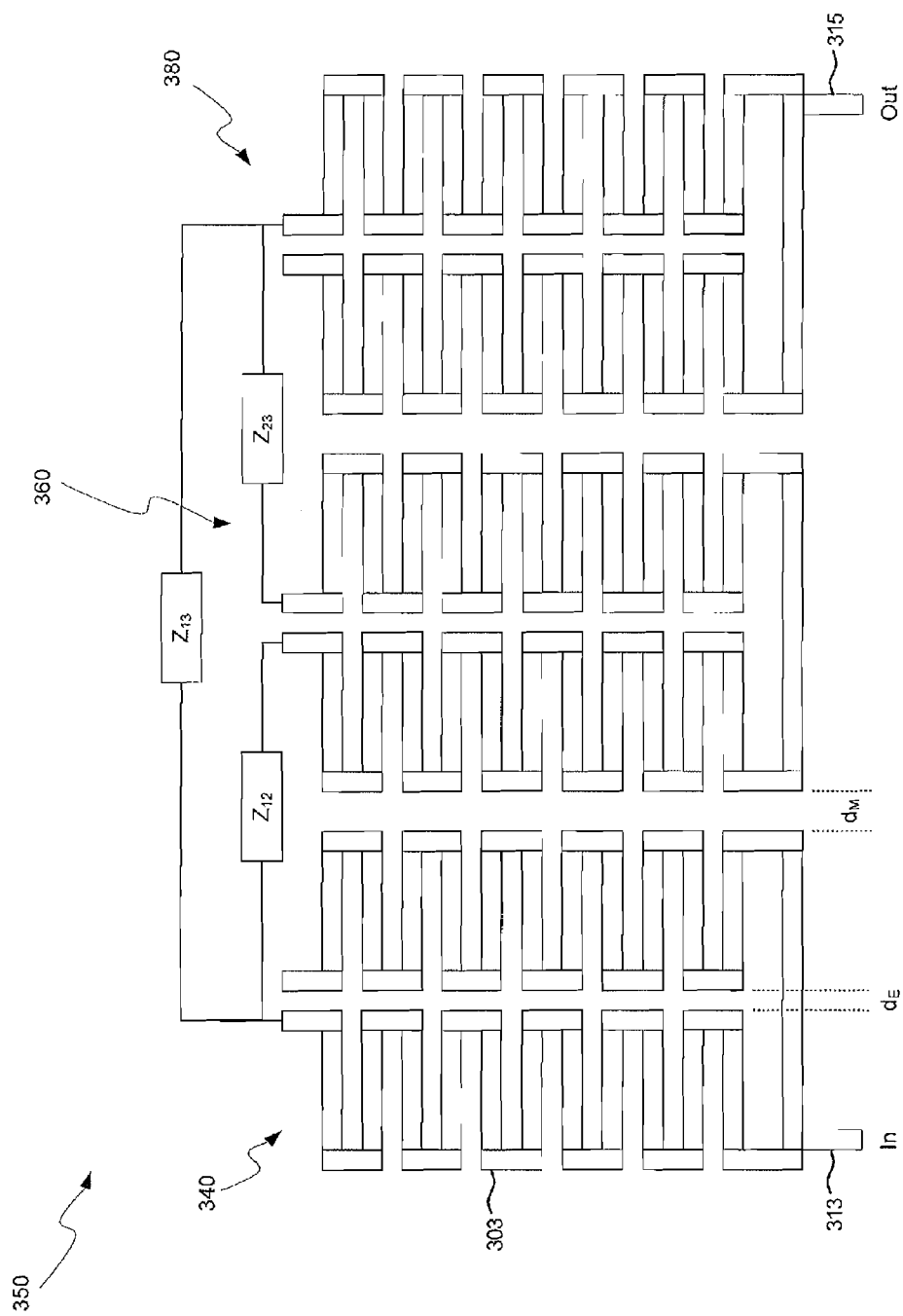
FIG. 3 is a block diagram of an exemplary microstrip bandpass filter fabricated on a multi-layer package, in accordance with an embodiment of the invention.

FIG. 3 is a block diagram of an exemplary microstrip bandpass filter fabricated on a multi-layer package, in accordance with an embodiment of the invention. Referring to FIG. 3, there is shown a microstrip bandpass filter 350 comprising three resonator sections 340, 360 and 380, an input coupler 313 and an output coupler 315. Each resonator section 340, 360 and 380 may comprise a pattern of signal conductive line 303. In addition, there is shown programmable impedances $Z_{12}$, $Z_{23}$ and $Z_{13}$. The pattern of signal conductive line 303 is an exemplary embodiment. The invention is not limited to this type of structure, as any number of patterns may be utilized to create a bandpass filter. Changing the shape may change the frequency response of the MS-BPF 350. In this manner, the frequency response may be tuned to a particular range with the design of the signal conductive line 303, and fine tuning may be accomplished by adjusting the programmable impedances $Z_{12}$, $Z_{23}$ and $Z_{13}$.

The signal conductive line 303 may be deposited on or embedded within the multi-layer package 213, and may be electrically coupled to the chip 201, described with respect to FIG. 2. In this manner the microstrip bandpass filter 350 may be utilized by an RF front end within the chip 201, and may be coupled to the chip 201 via a ball grid array, such as the solder balls 211.

The programmable impedances $Z_{12}$, $Z_{23}$ and $Z_{13}$ may comprise inductors and/or capacitors that may be programmably adjusted to modify the center frequency and bandwidth of the MS-BPF 350. The number and location of the impedances $Z_{12}$, $Z_{23}$ and $Z_{13}$ is not limited to the configuration shown in FIG. 3. Accordingly, any number of impedances may be used at multiple locations within the MS-BPF 350. The impedances $Z_{12}$, $Z_{23}$ and $Z_{13}$ may comprise switchable components fabricated on or embedded within the multi-layer package 213 and may be selected by a processor, such as the processor 156, described with respect to FIG. 1. Accordingly, the impedances $Z_{12}$, $Z_{23}$ and $Z_{13}$ may comprise a spiral inductor fabricated in the metal layer 209, for example, or may comprise surface mount devices 219A or 219B. In another embodiment of the invention, switched arrays of capacitors may be integrated in the chip 201 for capacitive elements of the impedances $Z_{12}$, $Z_{23}$ and $Z_{13}$.

The input and output couplers 313 and 315 may comprise inductive tap couplings for communicating signals into and out of the MS-BPF 350, respectively. In another embodiment of the invention, the input and output couplers 313 and 315 may comprise series-capacitance couplers.

In operation, an input signal may be communicated to the MS-BPF 350 via the input coupler 313. The desired frequency of operation may be configured by adjusting the impedances of the programmable impedances $Z_{12}$, $Z_{23}$ and $Z_{13}$. The filtered output signal may be communicated from the output coupler 315. In another embodiment of the invention, tuning may be accomplished by suspending portions of the MS-BPF 350 over the multi-layer package 213, with an air gap. By adjusting this air gap, via piezoelectric or electrostatic means, for example, the capacitance of the structure may be altered, adjusting the bandpass filter frequency. Furthermore, by integrating the MS-BFP 350 on the multi-layer package 213, coupled to the chip 201 via the solder balls 211, stray impedances from wire bonds may be eliminated, and accurate and precise control of filter center frequency and bandwidth may be obtained.

Figure 4:
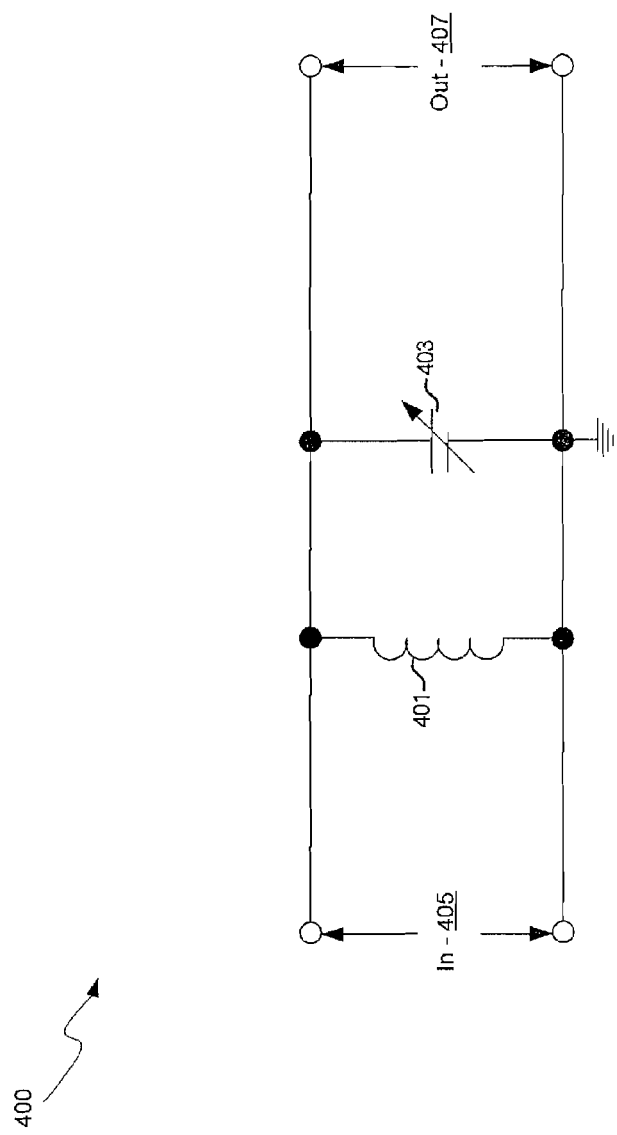
FIG. 4 is a block diagram illustrating an exemplary lumped element filter, in accordance with an embodiment of the invention.

FIG. 4 is a block diagram illustrating an exemplary lumped element filter, in accordance with an embodiment of the invention. Referring to FIG. 4, there is shown an LC filter 400 comprising an inductor 401 and a variable capacitance 403. There is also shown input terminals 405 and output terminals 407. The LC filter 400 may be enabled to filter an RF, IF or baseband signal as required, such as from a low noise amplifier in the chip 201, for example.

The inductor 401 may comprise an inductor integrated on the multi-layer package 213, described with respect to FIG. 2. For example, the inductor 401 may comprise a spiral conductor, for example, fabricated from the metal layer 209, described with respect to FIG. 2. In another embodiment of the invention, the inductor 401 may be fabricated utilizing ferromagnetic material, as described with respect to FIG. 2.

The variable capacitor 403 may comprise one or more capacitors fabricated on and/or embedded within the multi-layer package 213, which may be selected by the chip 201 for impedance matching the output impedance 405 with the load resistance 407. Each of the capacitors that comprise the variable capacitor 403 may be fabricated from parallel metal layers in the multi-layer package 213, such as the metal layers 207 and 217, for example. The number of layers comprising the one or more capacitors in the variable capacitor 403 is not limited to the number shown in FIG. 2. Accordingly, any number of individual capacitors may be fabricated as per the capacitance values required for filter requirements of the wireless system 150.

In another embodiment of the invention, the variable capacitance 403 may comprise a selectable array of capacitors integrated on the chip 201. In this manner, the capacitance value of the variable capacitor 403 may be controlled by a processor, such as the processor 156, described with respect to FIG. 1.

In operation, an RF, IF or baseband signal may be communicated to the input terminals 405 of the LC filter 400 to remove unwanted signals. The filtered output signal may be communicated out of the LC filter 400 at the output terminals 407, and communicated back to the chip 201, for example.

Figure 5:
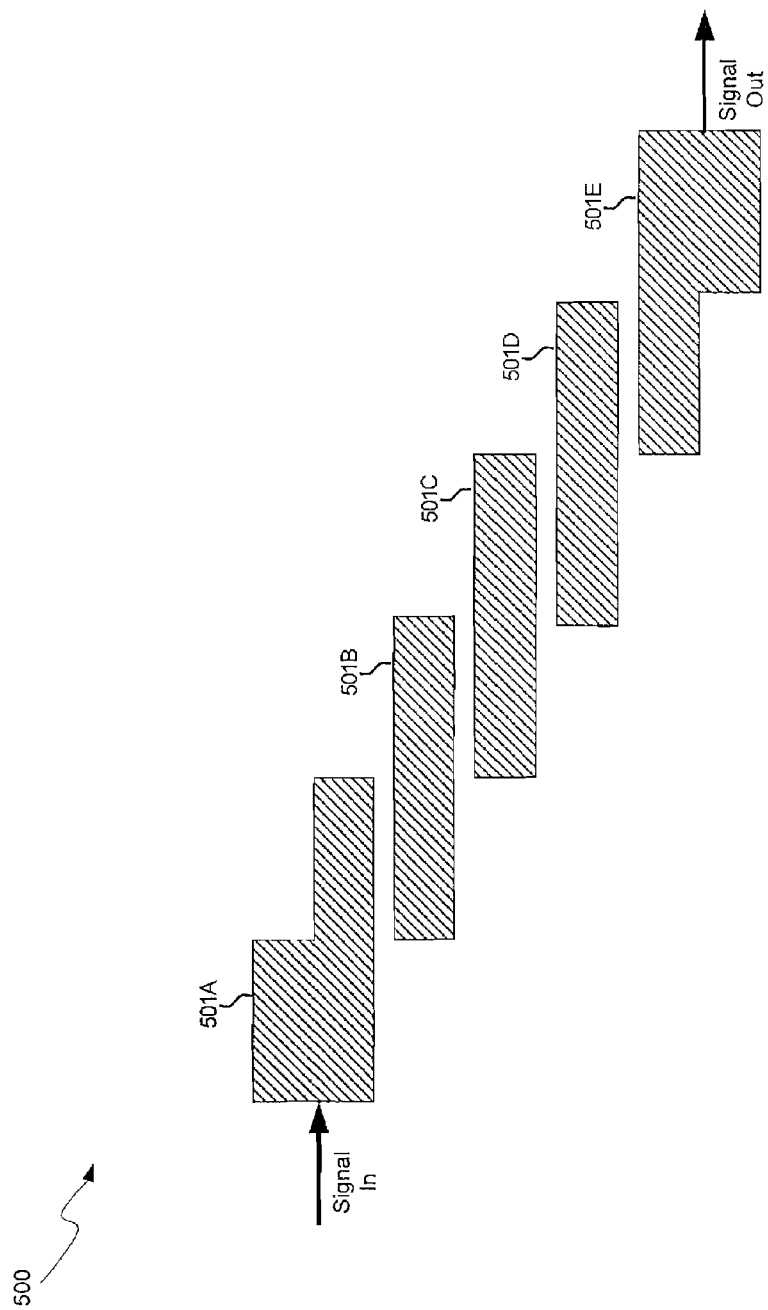
FIG. 5 is a block diagram illustrating an exemplary coupled line filter, in accordance with an embodiment of the invention.

FIG. 5 is a block diagram illustrating an exemplary coupled line filter, in accordance with an embodiment of the invention. Referring to FIG. 5, there is shown a coupled line filter 500 comprising conductive lines 501A, 501B, 501C, 501D, and 501E. The conductive lines 501A-E may comprise metal layers, such as the metal layers 209 and/or 217, described with respect to FIG. 2, and may be deposited on top of and/or on bottom of the multi-layer package 213. In an embodiment of the invention, a ground plane comprising a larger area of metal may be fabricated above and/or below the conductive lines 501A, 501B, 501C, 501D, and 501E, with an insulating layer, such as the insulating layer 203, described with respect to FIG. 2, sandwiched between them. In another embodiment of the invention, the conductive lines 501A, 501B, 501C, 501D, and 501E may be embedded in the multi-layer package 213 and may be sandwiched between two ground planes separated by insulating layers.

The length and the spacing between the conductive lines 501A, 501B, 501C, 501D, and 501E may determine the capacitance of the device at a particular frequency given the dielectric constant of the material underneath, such as the insulating layer 203. In this manner, the coupled line filter 500 may be enabled to pass signals at a specific frequency. In another embodiment of the invention, the coupled line filter may comprise a band-stop filter, which may be enabled to filter out an unwanted signal at a specific frequency, such as a known interferer signal, allowing other signals to pass.

In operation, an input signal may be communicated to the coupled line filter 500 by applying the signal to the conductive line 501A. The geometry of the coupled line filter 500 may determine the passband or stop band of the filter. The filtered output signal may be communicated out of the coupled line filter 500 via the conductive line 501E.

Figure 6:
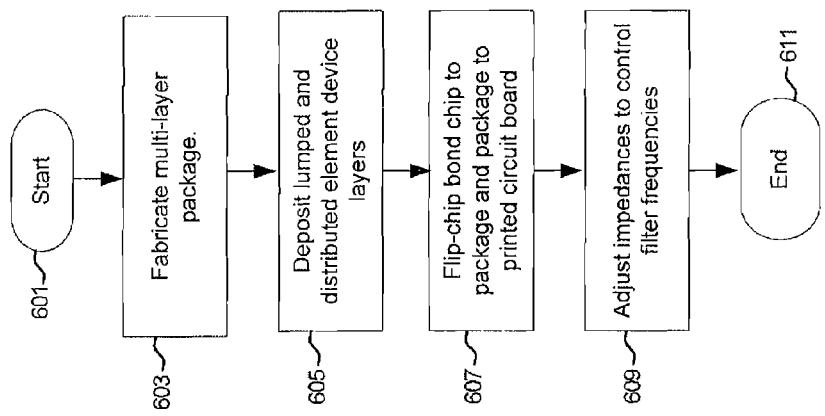
FIG. 6 is a flow diagram illustrating exemplary steps in the fabrication of filters embedded in a multi-layer package, in accordance with an embodiment of the invention.

FIG. 6 is a flow diagram illustrating exemplary steps in the fabrication of filters embedded in a multi-layer package, in accordance with an embodiment of the invention. In step 603, after start step 601, the multi-layer package may be fabricated with metal conductive and ferromagnetic layers embedded within the structure. In step 605, transmission line and magnetic layers for lumped and distributed element devices may be deposited on the top and/or bottom surfaces of the multi-layer package. In step 607, a chip may be flip-chip bonded to the multi-layer package and the package may then be flip-chip bonded to a printed circuit board. Thermal epoxy may be utilized to fill the volume between the solder balls between the chip and the package. In step 609, the impedances of devices on the multi-layer package or within the chip may be adjusted to control filter frequency and bandwidth, followed by end step 611.

In an embodiment of the invention, a method and system are disclosed for controlling filtering of signals within an integrated circuit 201 via one or more filter components embedded within a multi-layer package 213 bonded to the integrated circuit 201. Filter components may be integrated in the multi-layer package 213, and may be electrically coupled to one or more switchable capacitors in the integrated circuit 201. The filter components may comprise transmission line devices, microstrip filters, transformers, surface mount devices, inductors, and/or coplanar waveguide filters. The filter components may be fabricated utilizing metal conductive layers and/or ferromagnetic layers deposited on and/or embedded within the multi-layer package 213. The integrated circuit 201 may be electrically coupled to the multi-layer package 213 utilizing a flip-chip bonding technique.

Certain embodiments of the invention may comprise a machine-readable storage having stored thereon, a computer program having at least one code section for utilizing in a wireless communication system, filters embedded in an integrated circuit package, the at least one code section being executable by a machine for causing the machine to perform one or more of the steps described herein.

Accordingly, aspects of the invention may be realized in hardware, software, firmware or a combination thereof. The invention may be realized in a centralized fashion in at least one computer system or in a distributed fashion where different elements are spread across several interconnected computer systems. Any kind of computer system or other apparatus enabled for carrying out the methods described herein is suited. A typical combination of hardware, software and firmware may be a general-purpose computer system with a computer program that, when being loaded and executed, controls the computer system such that it carries out the methods described herein.

One embodiment of the present invention may be implemented as a board level product, as a single chip, application specific integrated circuit (ASIC), or with varying levels integrated on a single chip with other portions of the system as separate components. The degree of integration of the system will primarily be determined by speed and cost considerations. Because of the sophisticated nature of modern processors, it is possible to utilize a commercially available processor, which may be implemented external to an ASIC implementation of the present system. Alternatively, if the processor is available as an ASIC core or logic block, then the commercially available processor may be implemented as part of an ASIC device with various functions implemented as firmware.

The present invention may also be embedded in a computer program product, which comprises all the features enabling the implementation of the methods described herein, and which when loaded in a computer system is able to carry out these methods. Computer program in the present context may mean, for example, any expression, in any language, code or notation, of a set of instructions intended to cause a system having an information processing capability to perform a particular function either directly or after either or both of the following: a) conversion to another language, code or notation; b) reproduction in a different material form. However, other meanings of computer program within the understanding of those skilled in the art are also contemplated by the present invention.

While the invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiments disclosed, but that the present invention will include all embodiments falling within the scope of the appended claims.

What is claimed is:

1. A method for enabling communication, the method comprising:
controlling filtering of signals within an integrated circuit via one or more filter components embedded within a multi-layer package bonded to said integrated circuit, wherein said one or more filter components are electrically coupled to one or more switchable capacitors within said integrated circuit, said one or more switchable capacitors and said one or more filter components being configured to adjust a filter bandwidth, and wherein said one or more filter components include at least one variable capacitor and at least one resonator section formed by conductive layers embedded within said multi-layer package.

2. The method according to claim 1, wherein said filter components comprise transmission line devices.

3. The method according to claim 1, wherein said filter components comprise microstrip filters.

4. The method according to claim 1, wherein said filter components comprise transformers.

5. The method according to claim 1, wherein said filter components comprise surface mount devices.

6. The method according to claim 1, wherein said filter components comprise inductors.

7. The method according to claim 1, wherein said filter components comprise coplanar waveguide filters.

8. The method according to claim 1, comprising fabricating said filter components utilizing metal conductive layers deposited on and/or embedded within said multi-layer package.

9. The method according to claim 1, wherein said filter components comprise ferromagnetic layers deposited on and/or embedded within said multi-layer package.

10. The method according to claim 1, wherein said integrated circuit is electrically coupled to said multi-layer package utilizing a flip-chip bonding technique.

11. A system for enabling communication, the system comprising:
a multi-layer package comprising filter components, wherein said filter components include at least one variable capacitor and at least one resonator section formed by conductive layers embedded within said multi-layer package, said filter components are electrically coupled to one or more switchable capacitors in an integrated circuit, said one or more switchable capacitors and said filter components are configured to adjust a filter bandwidth, said multilayer package is bonded to said integrated circuit, and said multi-layer package and/or said integrated circuit enables filtering of signals.

12. The system according to claim 11, wherein said filter components comprise transmission line devices.

13. The system according to claim 11, wherein said filter components comprise microstrip filters.

14. The system according to claim 11, wherein said filter components comprise transformers.

15. The system according to claim 11, wherein said filter components comprise surface mount devices.

16. The system according to claim 11, wherein said filter components comprise inductors.

17. The system according to claim 11, wherein said filter components comprise coplanar waveguide filters.

18. The system according to claim 11, wherein said filter components comprise metal conductive layers deposited on and/or embedded within said multi-layer package.

19. The system according to claim 11, wherein said integrated circuit is electrically coupled to said multi-layer package utilizing a flip-chip technique.

* * * * *